United States Patent [19]

Ikeda

[11] Patent Number: 5,327,020
[45] Date of Patent: Jul. 5, 1994

[54] SCHMITT TRIGGER INPUT BUFFER CIRCUIT

[75] Inventor: Nobuyuki Ikeda, Itami, Japan

[73] Assignee: Mitsubishi Denki Kabushiki Kaisha, Tokyo, Japan

[21] Appl. No.: 967,105

[22] Filed: Oct. 27, 1992

[30] Foreign Application Priority Data

Oct. 29, 1991 [JP] Japan .................. 3-282562

[51] Int. Cl.⁵ .......................................... H03K 3/295
[52] U.S. Cl. .................... 307/290; 307/360; 307/445; 307/272.1
[58] Field of Search ............ 307/290, 360, 443, 445, 307/272.1, 272.3

[56] References Cited

U.S. PATENT DOCUMENTS

| | | | |
|---|---|---|---|
| 4,044,312 | 8/1977 | D'Ortenzio | 307/443 |
| 4,498,021 | 2/1985 | Uya | 307/360 |
| 4,703,202 | 10/1987 | Enomoto et al. | 307/443 |
| 4,786,824 | 11/1988 | Masuda | 307/290 |
| 5,097,147 | 3/1992 | Stuebing et al. | 307/360 |

FOREIGN PATENT DOCUMENTS 61-223671 10/1986 Japan .
62-292014 12/1987 Japan .
1123517  5/1989 Japan .

*Primary Examiner*—Timothy P. Callahan
*Assistant Examiner*—Shawn Riley
*Attorney, Agent, or Firm*—Thomas R. Morrison

[57] ABSTRACT

A Schmitt trigger input buffer circuit includes two inverting gates with different threshold voltages, which receive an input signal, a dual-input-AND pair and dual-input-NOR composite gate, and another inverting gate. Two of the inputs of the composite gate receive the outputs from the two inverting gates. The output signal of the composite gate and its inverted version are fed back respectively to the remaining two inputs of the composite gate.

22 Claims, 1 Drawing Sheet

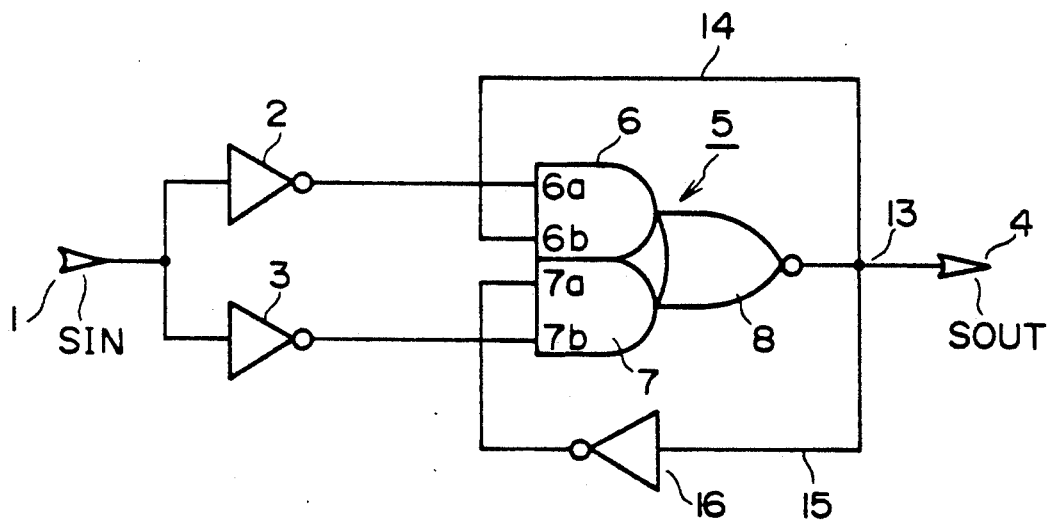
F I G. 2

SCHMITT TRIGGER INPUT BUFFER CIRCUIT

BACKGROUND OF THE INVENTION

Known types of Schmitt trigger input buffer circuits include one which uses a combination of CMOS inverters and a resistor, one which uses a R-S flip-flop comprising two NOR gates or two NAND gates, and one which uses three or more NAND gates.

An example of Schmitt trigger input buffer circuit using CMOS inverters and a resistor is shown in FIG. 6 of Japanese Unexamined Patent Publication No. SHO 62-292014 published on Dec. 18, 1987. The Schmitt trigger input buffer circuit of this type includes three inverters connected in series with an input terminal, a resistor connected in parallel with the series combination of the second and third inverters, and an output terminal connected to the output of the second inverter. A resistor may be substituted for the first inverter. Further, an inverting output terminal may be connected to the output of the third inverter. This type of Schmitt trigger input buffer circuit has disadvantages since the adjustment of its hysteresis characteristic is not easy and its input impedance cannot be large.

The second one of the above-mentioned types of Schmitt trigger input buffer circuits, which includes a R-S flip-flop employing NOR gates, is shown, for example, in FIG. 7 of Japanese Unexamined Patent Publication No. HEI 1-123517 published on May 16, 1989. An example of this type of Schmitt trigger input buffer circuit is shown in accompanying FIG. 1. The circuit of FIG. 1 includes an input terminal 1, a first input gate 2 comprising an inverting gate, a second input gate 3 comprising an inverting gate, an output terminal 4, and a third input gate 9 which is connected in series with the second input gate 3 and which comprises an inverting gate. The circuit further includes a first NOR gate 10 having two input terminals 10a and 10b, and a second NOR gate 11 having two input terminals 11a and 11b. In the above-cited Japanese Unexamined Patent Publication No. HEI 1-123517, a dual inverting input AND gate is used in place of the NOR gate 10, but its function is the same as that of NOR gate 10. The first and second NOR gates 10 and 11 form a R-S flip-flop 30.

An input signal SIN is applied at the input terminal 1 and coupled through two signal paths which respectively include the input gate 2, and the series combination of the input gates 3 and 9, to the R-S flip-flop circuit 30, as two inputs which are inverted with respect to each other. In the illustrated example, in FIG. 1, the input terminals 10a and 11b of the respective NOR gates 10 and 11 provide input terminals of R-S flip-flop circuit 30. An output signal SOUT is derived from an output terminal of R-S flip-flop circuit 30 or terminal 4, which is an output of the NOR gate 10.

In the R-S flip-flop 30, one input terminal 10a of the NOR gate 10 is connected to the output of the input gate 2, as stated above, and the other input terminal 10b of the NOR gate 10 is connected to the output of the NOR gate 11. One input terminal 11a of the NOR gate 11 is connected to the output of the NOR gate 10, and the other input terminal 11b is connected to the output of the input gate 9.

In the Schmitt trigger input buffer circuit with the above-described structure, a SET signal (not shown) having the same logic value (1 or 0) as the input signal SIN is applied from the input gate 9, a RESET signal (not shown) having a different logic value (0 or 1) is applied from the input gate 2, and, therefore, the output signal SOUT, having the same logic value as the input signal SIN, is developed at the output terminal 4. Hysteresis is provided for the output signal SOUT with respect to the input signal SIN by setting different threshold voltages VT2 and VT3 for the input gates 2 and 3, respectively.

Now, the operation of this Schmitt trigger input buffer circuit, when the amplitude of the input signal SIN applied to the input terminal 1 rises from the ground potential GND to a supply potential VDD, is explained.

When the input terminal 1 is at the ground potential GND, the outputs of the input gates 2 and 3 are at the supply potential VDD. Thus, the output of the third input gate 9 is at the ground potential GND. The first NOR gate 10 to which the output at the ground potential GND of the first input gate 2 is applied develops the ground potential GND as its output. The second NOR gate 11 receives the output value, i.e. the ground potential GND, of the third input gate 9, and also the output value, i.e. the ground potential GND, of the first NOR gate 10, and develops the supply potential VDD as its output.

As stated previously, input gates 2 and 3 have operating threshold values VT2 and VT3, respectively. Let it be assumed that $VT2 < VT3$. When the input signal voltage SIN increases and a condition in which $VT3 > SIN > VT2$ occurs, the output of the first input gate 2 is inverted to the ground potential GND. However, since the output of the NOR gate 11 remains at the supply potential VDD, no change occurs in the outputs of the NOR gates 10 and 11.

When the input signal SIN further increases to a value above the threshold voltage VT3 of the second input gate 3, the outputs of the input gates 3 and 9 are inverted so that the ground potential GND and the supply potential VDD are respectively developed. The second NOR gate 11 receives the supply potential VDD which is the output of the input gate 9, and develops the ground potential GND as its output. Therefore, first NOR gate receives the output GND from the NOR gate 11 and the output GND from the first input gate 2, and develops the supply potential VDD at its output.

Next, the operation in which the voltage of the input signal SIN at the input terminal 1 changes from the supply potential VDD down to the ground potential GND, is considered.

When the input terminal 1 is at the supply potential VDD, the outputs of both input gates 2 and 3 are at the ground potential GND. Accordingly, the output of the third gate 9 is at the supply potential VDD. This output of gate 9 causes the second NOR gate 11 to develop an output at the ground potential GND. The first NOR gate 10 receives the output at the ground potential GND of the input gate 2 and the output potential GND of the second NOR gate 11, and develops an output at the supply potential VDD as its output.

When the input signal SIN decreases and becomes below the lower one of the threshold voltages VT2 and VT3 of the input gates 2 and 3, VT3 in the present example, the outputs of the input gates 3 and 9 are inverted, so the output of the input gate 9 becomes the ground potential GND. This, however, does not affect the outputs of the NOR gates 10 and 11. When the input signal voltage SIN further decreases and becomes lower than the threshold voltage VT2 of the input gate 2, the output of the input gate 2 becomes the supply potential VDD and the output of the NOR gate 10 becomes the ground potential GND, while the NOR gate 11 develops an output at the supply potential VDD.

As is understood from the above-described operation, when the input signal SIN rises, the inversion of the output signal SOUT occurs at the higher threshold voltage VT3, while it occurs at the lower threshold voltage VT2 when the input signal SIN falls. Like this, the conventional Schmitt trigger input buffer circuit shown in FIG. 1 has different threshold voltages VT2 and VT3 for the input gates 2 and 3 (e.g. VT2<VT3), which provides the output signal SOUT with a hysteresis characteristic relative to the input signal SIN and, thus, provides a desired wave shaping function.

Because the hysteresis characteristic is determined by properly setting the operating threshold voltages of the two input gates, the adjustment of the hysteresis characteristic is easy, and the input impedance of this Schmitt trigger input buffer circuit can be chosen as desired.

However, the conventional Schmitt trigger input buffer circuit shown in FIG. 1 has a disadvantage because the R-S flip-flop circuit 30 is subject to external noise, such as noise contained in the input signal and noise undesirably introduced into it from power supply circuitry, it could operate erroneously.

For instance, let it be assumed that the input signal SIN slowly falls from the supply potential VDD toward the ground potential GND. When the input signal SIN decreases and crosses VT2, the output of the input gate 2 gradually increases toward the supply potential VDD. As explained above, in this condition, changes of the outputs of the NOR gates 10 and 11 are dependent on changes of the output of the input gate 2. Accordingly, when the potential at the input terminal 10a comes to have a value close to the threshold voltage of the NOR gate 10 as the output of the input gate 2 increases, the outputs of the NOR gates 10 and 11 change accordingly so that the other input terminal 10b of the gate 10 also receives a voltage near the threshold of the NOR gate 10.

This condition, however, is an unstable condition in which the output has not yet been changed completely. Therefore, if noise is applied through the input line, the power supply circuit or the like under this unstable condition, it is highly probable that the R-S flip-flop circuit 30 may operate erroneously in response to such noise.

Furthermore, if this Schmitt trigger input buffer circuit is formed as a CMOS circuit, unstable operating periods may occur because of an operating speed of P-channel MOSFET's which is slower than that of N-channel MOSFET's, and, therefore, if noise is applied during such unstable operating periods, the circuit may operate erroneously.

The third type of Schmitt trigger input buffer circuit which employs a R-S flip-flop comprising NAND gates is shown, for example, in FIGS. 7, 1 and 5 of Japanese Unexamined Patent Publication No. SHO 62-292014. This type of circuit includes a pair of dual-input NAND gates. One input of each of the NAND gates is coupled to the output of the other NAND gate, and anti-phased inputs are applied to the other inputs through appropriate input gates, such as inverters and NAND gates. Anti-phased outputs are derived from the pair of NAND gates. As in the case of the above-described second type of Schmitt trigger input buffer circuit, the adjustment of the hysteresis characteristic is relatively easy and an appropriate value of the input impedance can be obtained in this third type, too. However, it is impossible to prevent this circuit from being subject to erroneous operation caused by noise, too.

The fourth type of Schmitt trigger input buffer circuit which uses three or more NAND gates is shown, for example, in FIG. 4 of Japanese Unexamined Patent Publication No. SHO 61-223671 published on Oct. 4, 1987. This circuit includes first and second dual-input NAND gates. An input signal is applied to one of inputs of each NAND gates. The outputs of the two NAND gates are applied to first and second inputs of a third dual-input NAND gate, respectively. The output of the third NAND gate is coupled back to the other input of the second NAND gate. The two inputs of the first NAND gate are coupled together.

Adjustment of the hysteresis characteristic of this circuit is relatively easy, but the circuit tends to erroneously operate in response to noise.

OBJECTS AND SUMMARY OF THE INVENTION

Accordingly, it is an object of the present invention to provide a noise-resistant Schmitt trigger input buffer circuit, whose operation is not affected by noise, such as external noise and power supply noise and, thus, which does not operate erroneously in response to such noise.

Another object of the present invention is to provide a Schmitt trigger input buffer circuit which is resistant against noise, which has an easily adjustable hysteresis characteristic, and which exhibits stable circuit operating characteristics.

A still further object of the present invention is to provide a Schmitt trigger input buffer circuit which does not use a R-S flip-flop, and which is still noise-resistant, i.e. which does not exhibit erroneous operation in response to noise.

A still further object of the present invention is to provide a Schmitt trigger input buffer circuit which is free of any resistors and can be formed by CMOS devices. Thus, the circuit, when fabricated in an integrated circuit form, occupies little area of the integrated circuit.

A further object of the present invention is to provide a Schmitt trigger input buffer circuit which can be formed of CMOS devices including P-type MOS devices slower in operating speed than N-type MOS devices and, thus, tending to have unstable operating periods, and which nevertheless is not affected by external noise.

Briefly, a Schmitt trigger input buffer circuit according to the present invention includes two input gates (inverting gates) with different threshold voltages to which an input signal is applied, and a dual-input-AND pair and dual-input-NOR composite gate arrangement including a pair of dual-input AND gates and a dual-input NOR gate (hereinafter referred to simply as composite gate arrangement). One input of each dual-input AND gate receives the output of one of the two input gates. The output of the composite gate arrangement and its inverted version are fed back to the other inputs of the two dual-input AND gates, respectively. A composite gate arrangement includes a pair of AND gates each having two inputs and one output, and one dual-input NOR gate receiving the outputs from the two dual-input AND gates, or it is a four-input-terminal one-output-terminal gate achieving the equivalent function.

According to the present invention, the output signal and its inverted version are fed back to the respective input terminals of the two dual-input AND gates of the composite gate arrangement. These two feedback signals are used to select one of the outputs of the two input gates which is to be developed as the output of the composite gate arrangement. The two feedback signals are opposite in phase and their action on their associated dual-input AND gates are definitely different. Thus, the respective dual-input AND gates supplied with these two feedback signals have their states clearly defined, namely, ENABLED state or DISABLED state. As a result, for example, one of the two dual-input AND gates develops an output, e.g. the supply potential VDD or the ground potential GND, depending on an input applied thereto, and the other dual-input AND gate develops an output at the ground potential GND regardless of the input applied thereto. Ultimately, the composite gate arrangement develops an output determined by the input to the enabled or selected dual-input AND gate. Thus, there can be no ambiguity in operation. Consequently, noise does not trigger erroneous operation of the circuit, as occurs in circuits in which a R-S flip-flop is used.

Now, the present invention is described with reference to one embodiment shown in the accompanying drawing. The above and other objects and advantages of the present invention will be clear from the following detailed description read in conjunction with the accompanying drawing in which like reference numerals designate the same element.

BRIEF DESCRIPTION OF THE DRAWINGS

FIG. 2 is a novel Schmitt trigger input buffer circuit according to one embodiment of the present invention.

DETAILED DESCRIPTION OF THE PREFERRED EMBODIMENT

Figure 1:
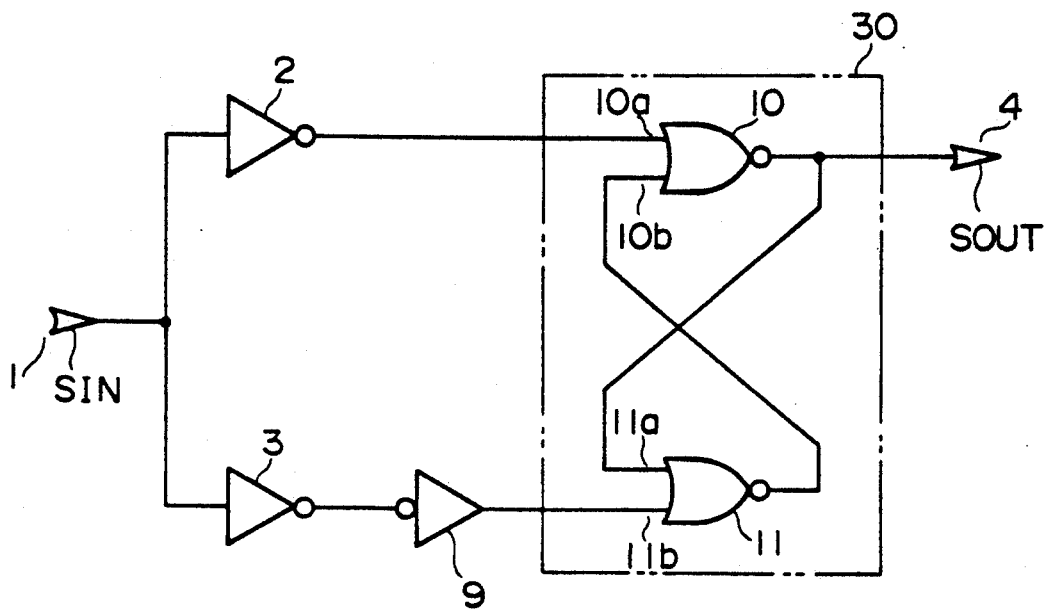
FIG. 1 shows an example of a conventional Schmitt trigger input buffer circuit which uses a R-S flip-flop employing two NOR circuits.

In FIG. 2, a Schmitt trigger input buffer circuit according to one embodiment of the present invention is shown. In FIG. 2, components with the same reference numerals as used in FIG. 1 are similar or equivalent components. The Schmitt trigger input buffer circuit of FIG. 2 includes a dual-input-AND pair and dual-input-NOR composite gate arrangement 5. The composite gate arrangement 5 includes two dual-input AND gates 6 and 7 and a dual-input NOR gate 8 which receives the outputs of the AND gates 6 and 7 as its inputs. These dual-input AND gates and the dual-input NOR gate are integrally fabricated. A circuit having a similar function may be used in place of the illustrated composite gate arrangement.

The outputs of the input gates (inverting gates) 2 and 3 are coupled to one inputs 6a and 7b of the dual-input AND gates 6 and 7 of the composite gate arrangement 5, respectively. The output of the composite gate arrangement 5 is derived from a circuit node 13 and developed at an output terminal 4. The circuit node 13 is coupled through a path 14 to the other input 6b of the dual-input AND gate 6, and also to the other input 7a of the dual-input AND gate 7 through a path 15 including an inverting gate 16. Thus, two feedback paths are provided from the output to the inputs of the composite gate arrangement 5. The inverting gate 16 has its input connected to the circuit node 13 and its output connected to the input terminal 7b. The circuit components and arrangement described thus far can be fabricated by known MIS or CMOS technology.

In operation, an input signal SIN, applied at the input terminal 1 is applied to the two input gates 2 and 3 from which it is applied to the input terminals 6a and 7b of the composite gate arrangement 5. An output signal SOUT of the circuit appears at the output terminal 4.

First, the circuit operation in which the input signal SIN, applied at the input terminal 1, rises from the ground potential GND to the supply potential VDD is discussed.

When the input terminal 1 is at the ground potential GND, the input gates 2 and 3 develop outputs at the supply potential VDD, which are coupled to the composite gate arrangement 5. Then, the composite gate arrangement 5 develops an output at the ground potential GND, since the input terminals 6b and 7a of the composite gate arrangement 5 always receive mutually opposite potentials because of the presence of the inverting gate 16. As a result, the input terminals 6b and 7a receive the ground potential GND and the supply potential VDD, respectively. Incidentally, for simplicity of explanation, it is assumed that each of the two dual-input AND gates 6 and 7 is enabled and disabled when it receives a higher or supply potential (VDD) and a lower or ground potential (GND) at its input terminal 6b or 7a, respectively.

The input signal SIN is gradually increased. Let it be assumed that the input gates 2 and 3 have threshold voltages of VT2 and VT3, respectively, and that $VT2 < VT3$. When the input signal SIN increases and a condition in which $VT3 > SIN > VT2$ occurs, the output of the input gate 2 is inverted to the ground potential GND. However, this does not cause any change in the output of the composite gate arrangement 5. Then, as the input signal SIN further increases to a value above the threshold voltage VT3 of the input gate 3, the output of the input gate 3 is also inverted to the ground potential GND. This causes the supply potential VDD and the ground potential GND to be applied to the input terminals 7a and 7b, respectively, of the dual-input AND gate 7. Consequently, the composite gate arrangement 5 develops the output signal SOUT at the supply potential VDD.

Next, the circuit operation when the input signal SIN, at the input terminal 1, falls from the supply voltage VDD to the ground potential GND is considered.

First, when the potential at the input terminal 1 is at the supply potential VDD, both of the input gates 2 and 3 develop outputs at the ground potential GND. The composite gate arrangement 5, receiving the outputs at the ground potential GND from the input gates 2 and 3, develops an output at the supply potential VDD which is fed back so that the input terminals 6b and 7a receive the supply potential VDD and the ground potential GND, respectively.

Then, the input signal SIN is gradually decreased. When the input signal SIN goes below the higher one of the threshold voltages of the input gates 2 and 3, namely, VT3 in the present case, the input gate 3 develops an output at the supply potential VDD. However, the output of the input gate 2 is maintained at the ground potential GND. Accordingly, the output of the composite gate arrangement 5 is not affected. As the input signal voltage SIN further decreases to a value which is lower than both of the thresholds of the input gates 2 and 3, the two input gates 2 and 3 develop outputs at the supply potential VDD so that the composite gate arrangement 5 develops the output signal SOUT at the ground potential GND.

As fully described above, in the circuit of the present invention shown in FIG. 2, during the increase and decrease of the input signal SIN, the output signal SOUT changes its state, this output signal SOUT, having its state changed is fed back in the form of signals in opposite phase to the inputs 6b and 7a of the composite gate arrangement 5. One of the outputs of the input gates 2 and 3 having different threshold voltages is selected by these feedback signals as the input to the composite gate arrangement 5 which determines the output of the composite gate arrangement 5. It should be noted that in the illustrated embodiment, the output of the composite gate arrangement 5 is an inverted version of the selected input. That is, when the selected input is at VDD, the output is at GND, and vice versa. Thus, according to the present invention, a stable hysteresis characteristic and, hence, a desired input wave shaping are realized without resort to any R-S flip-flop circuit.

Various modifications and alterations to the above-described circuit are possible. For example, simple buffer circuits having different threshold voltages may be substituted for the inverting input gates 2 and 3. Further, if the composite gate arrangement 5 includes a section which provides a phase-inverted output, the inverting gate 16 can be removed.

As described above, according to the present invention, a Schmitt trigger input buffer circuit is provided, which can realize a stable hysteresis characteristic without resort to the use of a R-S flip-flop circuit employing NOR gates or NAND gates. In addition, since the output signal and its inverted version are fed back to the input section to select the inputs thereto for defining the output of the circuit, there is no possibility that unstable operating conditions may occur even if the composite gate arrangement comprises CMOS's containing P-type MOS's of which the operating speed is lower than that of N-type MOS's. Accordingly, erroneous operation caused by occurrences of unstable conditions and incoming noise can be completely eliminated. Furthermore, since the operation speed of P-type MOS's need hardly be taken into account, the entire circuit can be formed by CMOS's, which enables a compact circuit to be formed. Furthermore, the input impedance of the circuit can be chosen to be high.

Having described preferred embodiments of the invention with reference to the accompanying drawings, it is to be understood that the invention is no limited to those precise embodiments, and that various changes and modifications may be effected therein by one skilled in the art without departing from the scope or spirit of the invention as defined in the appended claims. .

What is claimed is:

1. A Schmitt trigger input buffer circuit, comprising:
an input terminal;
a first input gate having a first output;
a second input gate having a second output;
said first and second input gates being connected in parallel to said input terminal and having different operating threshold voltages;
a dual-input-AND pair and dual-input-NOR composite gate having a first set of inputs connected respectively to said first and second output of said first and second input gate, having a second set of inputs for independently enabling said composite gate to be responsive to a selected one of said first set of inputs, and having an output;
an output terminal connected to said output of said composite gate; and
a circuit for feeding back said output signal of said composite gate to said second set of inputs of said composite gate.

2. A Schmitt trigger input buffer circuit, comprising:
an input terminal;
a first input gate having a first output;
a second input gate having a second output;
said first and second input gates being connected in parallel to said input terminal and having different operating threshold voltages;
a dual-input-AND pair and dual-input-NOR composite gate having a first set of inputs connected respectively to said first and second output of said first and second input gate, having a second set of inputs for independently enabling said composite gate to be responsive to a selected one of said first set of inputs, and having an output;
an output terminal connected to said output of said composite gate; and
one of said first and second output signals of said first and second input gates that are applied to said first set of inputs of said composite gate is selected to define said output of said composite gate by a feedback signal from said output of said composite gate.

3. A Schmitt trigger input buffer circuit, comprising:
an input terminal;
a first input gate having a first output;
a second input gate having a second output;
said first and second input gates being connected in parallel to said input terminal and having different operating threshold voltages;
a dual-input-AND pair and dual-input-NOR composite gate having a first set of inputs connected respectively to said first and second output of said first and second input gate, having a second set of inputs for independently enabling said composite gate to be responsive to a selected one of said first set of inputs, and having an output;
means for feeding back said output signal and its inverted version from said composite gate to said second set of inputs; and
an output terminal connected to said output of said composite gate.

4. A Schmitt trigger input buffer circuit, comprising:
an input terminal;
a first input gate having a first output;
a second input gate having a second output;
said first and second input gates being connected in parallel to said input terminal and having different operating threshold voltages;
a dual-input-AND pair and dual-input-NOR composite gate having a first set of inputs connected respectively to said first and second output of said first and second input gate, having a second set of inputs for independently enabling said composite gate to be responsive to a selected one of said first set of inputs, and having an output;
means for connecting said output of said composite gate to a one of said second set of inputs;
means for connecting said output of said composite gate to another one of said second set of inputs via an inverting gate; and an output terminal connected to said output of said composite gate.

5. A Schmitt trigger input buffer circuit according to claim 2, wherein said first and second input gates and said dual-input-AND pair and dual-input-NOR composite gate arrangement are CMOS devices.

6. A Schmitt trigger input buffer circuit according to claim 1, wherein said first and second input gates are inverters.

7. A Schmitt trigger input buffer circuit according to claim 5 wherein said input gates are inverters.

8. A Schmitt trigger input buffer circuit according to claim 1, wherein said first and second input gates are buffer circuits having different operating threshold voltages.

9. A Schmitt trigger input buffer circuit according to claim 5 wherein said first and second input gates are buffer circuits having different operating threshold voltages.

10. A Schmitt trigger input buffer circuit according to claim 1, wherein said composite gate includes means for producing an inverted version of said output signal of said composite gate.

11. A Schmitt trigger input buffer circuit according to claim 3, wherein said first and second input gates and said composite gate are CMOS devices.

12. A Schmitt trigger input buffer circuit according to claim 4, wherein said first and second input gates and said composite gate are CMOS devices.

13. A Schmitt trigger input buffer circuit according to claim 2, wherein said first and second input gates are buffer circuits having different operating voltages.

14. A Schmitt trigger input buffer circuit according to claim 3, wherein said first and second input gates are buffer circuits having different operating voltages.

15. A Schmitt trigger input buffer circuit according to claim 4, wherein said first and second input gates are buffer circuits having different operating voltages.

16. A Schmitt trigger input buffer circuit according to claim 2, wherein said composite gate includes means for producing an inverted version of said output signal of said composite gate.

17. A Schmitt trigger input buffer circuit according to claim 3, wherein said composite gate includes means for producing an inverted version of said output signal of said composite gate.

18. A Schmitt trigger comprising:
an input circuit having a first and a second output, said first and second output each being responsive at a different threshold of an input signal applied to said input circuit;
a logic circuit having a first and second set of inputs wherein a first input of each of said first and second set of inputs enables said logic circuit to be responsive to a signal applied to a selected second input of said first and second set of inputs;
said second input of each of said first and second set of inputs respectively connected to said first and second outputs of said input circuit;
said logic circuit having an output responsive to said selected second input;
feedback means, applied to said first inputs, for enabling said logic circuit, to be responsive to an output of said first and second outputs that is last to respond to a transition of said input signal applied to said input circuit; and
said feedback means having said output of said logic circuit as an input.

19. A Schmitt trigger according to claim 18, wherein said logic circuit comprises:
a pair of dual input AND gates driving a dual input NOR gate.

20. A Schmitt trigger according to claim 18, wherein said feedback means includes a connection from said output of said output circuit to one of said first inputs and an invertor connecting said output to another one of said first inputs.

21. A Schmitt trigger according to claim 18, wherein said input circuit comprises:
a first and a second buffer; and
said first and said second buffer having a different threshold voltage.

22. A Schmitt trigger according to claim 18, wherein said input circuit comprises:
a first and a second invertor; and
said first and said second invertor having a different threshold voltage.

* * * * *